(12) United States Patent
Lenef et al.

(10) Patent No.: US 11,226,082 B1
(45) Date of Patent: Jan. 18, 2022

(54) OPTOELECTRONIC LIGHT SOURCE

(71) Applicants: OSRAM Opto Semiconductors GmbH, Regensburg (DE); The Research Foundation for State University of New York, Albany, NY (US)

(72) Inventors: Alan Lenef, Belmont, MA (US); David Klotzkin, Vestal, NY (US); Xin Wen, Guangzhou (CN)

(73) Assignees: OSRAM Opto Semiconductors GmbH, Regensburg (DE); The Research Foundation for State University of New York, Albany, NY (US)

( * ) Notice: Subject to any disclaimer, the term of this patent is extended or adjusted under 35 U.S.C. 154(b) by 0 days.

(21) Appl. No.: 16/992,611

(22) Filed: Aug. 13, 2020

(51) Int. Cl.
  *F21V 9/32* (2018.01)
  *H01S 5/343* (2006.01)
  *F21Y 115/30* (2016.01)

(52) U.S. Cl.
  CPC ............. *F21V 9/32* (2018.02); *F21Y 2115/30* (2016.08); *H01S 5/34333* (2013.01)

(58) Field of Classification Search
  CPC .................... F21Y 2115/30; H01S 5/34333
  USPC ........................................................ 362/84
  See application file for complete search history.

(56) References Cited

U.S. PATENT DOCUMENTS

| 10,132,465 | B2 | 11/2018 | Byrnes et al. |
| 2016/0069538 | A1* | 3/2016 | Chang .................... F21V 14/08 362/84 |
| 2019/0186711 | A1 | 6/2019 | Lenef et al. |
| 2019/0323663 | A1* | 10/2019 | Rudy ...................... H01S 5/023 |
| 2020/0232618 | A1* | 7/2020 | Rudy .................... H01S 5/2201 |

FOREIGN PATENT DOCUMENTS

WO 2017/214464 A1 12/2017

OTHER PUBLICATIONS

U.S. Appl. No. 16/291,679, filed Mar. 4, 2019, Alan Lenef et al.

\* cited by examiner

*Primary Examiner* — Christopher M Raabe
(74) *Attorney, Agent, or Firm* — DLA Piper LLP (US)

(57) ABSTRACT

An optoelectronic light source includes a semiconductor laser configured to produce polarized primary radiation, a converter material configured to absorb at least part of the primary radiation and convert the primary radiation into a secondary radiation of an increased wavelength, a planar multi-layered mirror located between the semiconductor laser and the converter material, the multi-layered mirror configured to transmit the primary radiation and reflect the secondary radiation, and an optical element provided between the semiconductor laser and the multi-layered mirror, wherein the optical element is configured such that the primary radiation coming from the semiconductor laser impinges on the multi-layered mirror at a Brewster angle.

16 Claims, 11 Drawing Sheets

| 5 | 61, 62 | 4 | P; $\lambda_p$=450 nm | | | | | | | |
|---|---|---|---|---|---|---|---|---|---|---|
| | | | $n_p$ | $n_b$ | $n_1$ | $n_2$ | $n_{th}$ | $\theta_p$ | $\phi$ | $\theta_{inc}$ |
| Borosilicate | Silicone (methyl) | $SiO_2/Ta_2O_5$ | 1.51 | 1.41 | 1.48 | 2.20 | 1.23 | 54.4° | 20.9° | 69.1° |
| Borosilicate | Silicone (methyl) | $SiO_2/TiO_2$ | 1.51 | 1.41 | 1.48 | 2.53 | 1.28 | 57.8° | 24.3° | 65.7° |
| Sapphire | Silicone (methyl) | $SiO_2/Ta_2O_6$ | 1.78 | 1.41 | 1.48 | 2.20 | 1.23 | 43.6° | 14.3° | 75.7° |
| Sapphire | Silicone (methyl) | $SiO_2/TiO_2$ | 1.78 | 1.41 | 1.48 | 2.53 | 1.28 | 45.9° | 16.6° | 73.4° |
| Sapphire | Low-temp glass | $SiO_2/Ta_2O_6$ | 1.78 | 1.93 | 1.48 | 2.20 | 1.23 | 43.8° | 14.3° | 75.7° |
| Sapphire | Low-temp glass | $SiO_2/TiO_2$ | 1.78 | 1.93 | 1.48 | 2.53 | 1.28 | 45.9° | 16.6° | 73.4° |

FIG 5

| | | t [nm] | | | |
|---|---|---|---|---|---|
| Layer 1 | Ta2O5 | 109.51 | Layer 31 | Ta2O5 | 46.47 |
| Layer 2 | SiO2 | 388.7 | Layer 32 | SiO2 | 70.19 |
| Layer 3 | Ta2O5 | 110.78 | Layer 33 | Ta2O5 | 46.04 |
| Layer 4 | SiO2 | 143.2 | Layer 34 | SiO2 | 70.32 |
| Layer 5 | Ta2O5 | 16.75 | Layer 35 | Ta2O5 | 53.1 |
| Layer 6 | SiO2 | 167.5 | Layer 36 | SiO2 | 79.66 |
| Layer 7 | Ta2O5 | 101.1 | Layer 37 | Ta2O5 | 60.06 |
| Layer 8 | SiO2 | 136.9 | Layer 38 | SiO2 | 86.15 |
| Layer 9 | Ta2O5 | 78.07 | Layer 39 | Ta2O5 | 47.81 |
| Layer 10 | SiO2 | 134.8 | Layer 40 | SiO2 | 67.19 |
| Layer 11 | Ta2O5 | 76.42 | Layer 41 | Ta2O5 | 97.82 |
| Layer 12 | SiO2 | 105.7 | Layer 42 | SiO2 | 139.2 |
| Layer 13 | Ta2O5 | 83.59 | Layer 43 | Ta2O5 | 50.56 |
| Layer 14 | SiO2 | 117.3 | Layer 44 | SiO2 | 84.01 |
| Layer 15 | Ta2O5 | 62.46 | Layer 45 | Ta2O5 | 48.67 |
| Layer 16 | SiO2 | 94.54 | Layer 46 | SiO2 | 77.75 |
| Layer 17 | Ta2O5 | 60.95 | Layer 47 | Ta2O5 | 94.88 |
| Layer 18 | SiO2 | 92.6 | Layer 48 | SiO2 | 133.5 |
| Layer 19 | Ta2O5 | 74.87 | Layer 49 | Ta2O5 | 64.44 |
| Layer 20 | SiO2 | 107.6 | Layer 50 | SiO2 | 98.67 |
| Layer 21 | Ta2O5 | 78.26 | Layer 51 | Ta2O5 | 86.18 |
| Layer 22 | SiO2 | 115.2 | Layer 52 | SiO2 | 129.8 |
| Layer 23 | Ta2O5 | 43.84 | Layer 53 | Ta2O5 | 87.3 |
| Layer 24 | SiO2 | 70.28 | Layer 54 | SiO2 | 130.8 |
| Layer 25 | Ta2O5 | 57.91 | Layer 55 | Ta2O5 | 132.9 |
| Layer 26 | SiO2 | 84.91 | Layer 56 | SiO2 | 178.5 |
| Layer 27 | Ta2O5 | 73.04 | Layer 57 | Ta2O5 | 73.04 |
| Layer 28 | SiO2 | 102.5 | Layer 58 | SiO2 | 181.4 |
| Layer 29 | Ta2O5 | 63.69 | Layer 59 | Ta2O5 | 59.92 |
| Layer 30 | SiO2 | 94.5 | Layer 60 | SiO2 | 168.9 |
| | | | YAG | | |

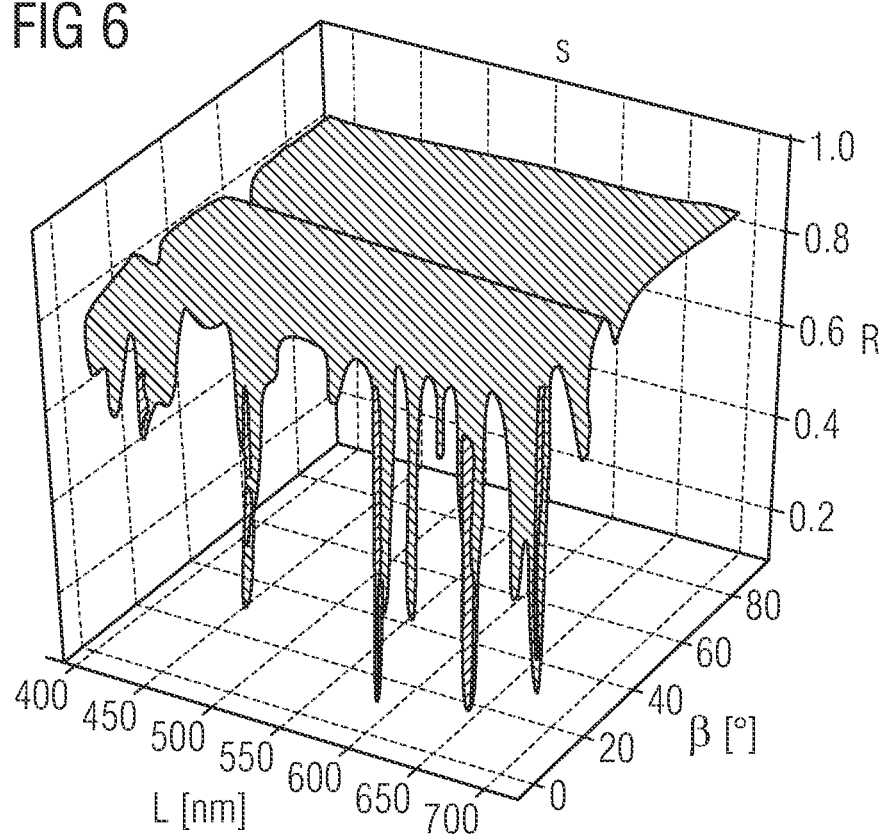

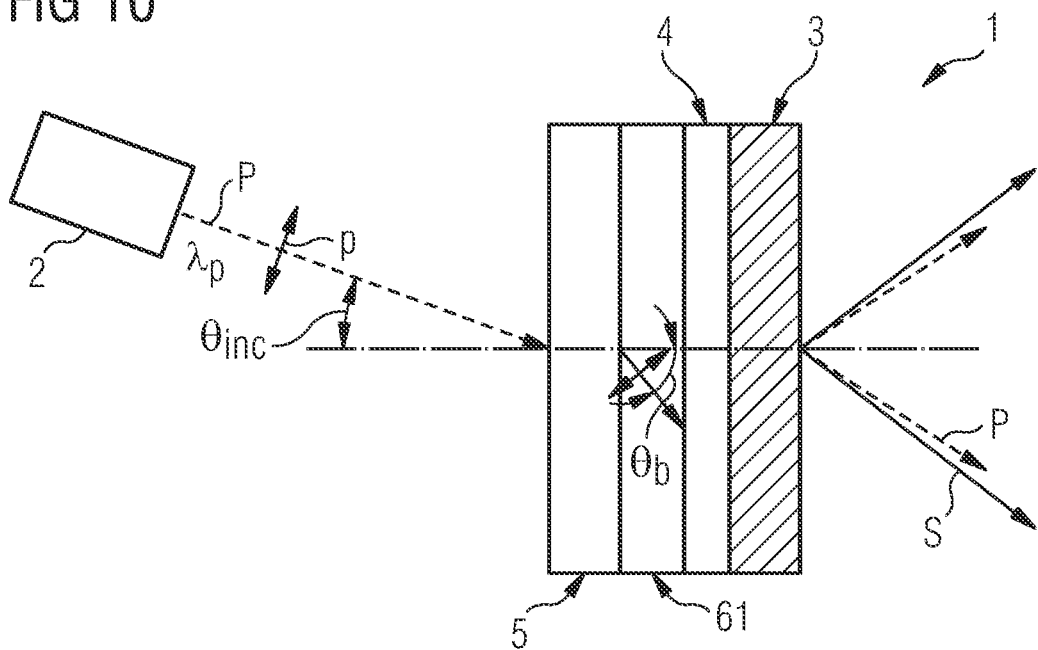
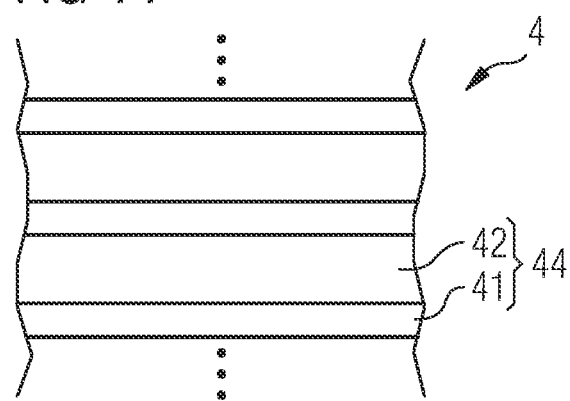

OPTOELECTRONIC LIGHT SOURCE

TECHNICAL FIELD

This disclosure relates to an optoelectronic light source that generates visible light.

BACKGROUND

There is a need to provide an optoelectronic light source in which primary radiation is coupled optically efficiently to a conversion material.

SUMMARY

We provide an optoelectronic light source including a semiconductor laser configured to produce polarized primary radiation, a converter material configured to absorb at least part of the primary radiation and convert the primary radiation into a secondary radiation of an increased wavelength, a planar multi-layered mirror located between the semiconductor laser and the converter material, the multi-layered mirror configured to transmit the primary radiation and reflect the secondary radiation, and an optical element provided between the semiconductor laser and the multi-layered mirror, wherein the optical element is configured such that the primary radiation coming from the semiconductor laser impinges on the multi-layered mirror at a Brewster angle.

We also provide the optoelectronic light source including a semiconductor laser configured to produce polarized primary radiation, a converter material configured to absorb at least part of the primary radiation and convert the primary radiation into a secondary radiation of an increased wavelength, a planar multi-layered mirror located between the semiconductor laser and the converter material, the multi-layered mirror configured to transmit the primary radiation and reflect the secondary radiation, and an optical element provided between the semiconductor laser and the multi-layered mirror, wherein the optical element is configured such that the primary radiation coming from the semiconductor laser impinges on the multi-layered mirror at a Brewster angle and is a prism, a planar light-entrance face for the primary radiation of the optical element being oriented obliquely with the multi-layered mirror.

BRIEF DESCRIPTION OF THE DRAWINGS

FIG. 5 shows data of a dichroic mirror for examples of our optoelectronic light sources.

FIGS. 6 to 8 show schematic representations of reflectivity of dichroic mirrors for examples of our optoelectronic light sources.

FIGS. 9 and 10 show schematic side view of examples of our optoelectronic light sources.

FIG. 11 shows a dichroic mirror for examples of our optoelectronic light sources.

Figure 1:
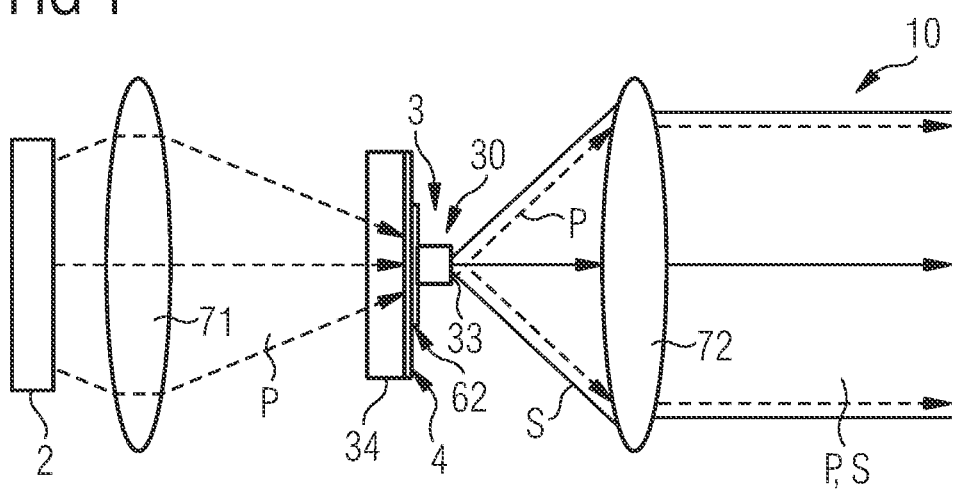
FIG. 1 shows a schematic side view of a modified light source not comprising our optical element.

LIST OF REFERENCE SIGNS 1 optoelectronic light source
2 semiconductor laser
22 light guide
3 converter material
30 luminescent region
33 light-exit face
34 substrate
4 multi-layered mirror
41 first layer
42 second layer
44 layer pair
5 optical element
50 anti-reflection coating
51 light-entrance face
55 nano-pillar
61 first adhesive layer
62 second adhesive layer
71 first focusing optics
72 second focusing optics
8 heat sink
9 housing
10 modified light source
B region with a Brewster angle effect
β angle as seen from the converter material
φ prism angle
Kx Kx=sin $\theta_{ph}$, where $\theta_{ph}$ is the angle of incidence
L wavelength in nm
n refractive index
p polarization
P primary radiation
R reflectivity in %
S secondary radiation
t layer thickness in nm
T structural period in the meta-optics

DETAILED DESCRIPTION

Primary radiation of a semiconductor laser impinges at a Brewster angle on a Bragg mirror located between the semiconductor laser and a converter material. Thus, reflection losses of a primary radiation from the semiconductor laser at the Bragg mirror are minimized, and the Bragg mirror can be controlled for omni-angular reflection of secondary radiation generated in the converter material.

The optoelectronic light source may comprise at least one semiconductor laser configured to produce polarized primary radiation. The one laser or the plurality of lasers may comprise a semiconductor layer sequence to produce the primary radiation by electroluminescence.

The semiconductor layer sequence may be based on a III-V compound semiconductor material. The semiconductor material may be, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein each pf 0≤n≤1, $0 \leq m \leq 1$ and $n+m \leq 1$ applies. The semiconductor layer sequence may comprise dopants and additional constituents. For simplicity's sake, however, only the essential constituents of the crystal lattice of the semiconductor layer sequence are indicated, that is, Al, As, Ga, In, N or P, even if they may in part be replaced and/or supplemented by small quantities of further substances. The semiconductor layer sequence is particularly preferably based on the AlInGaN material system to produce near-ultraviolet radiation and/or blue light.

The optoelectronic light source may comprise at least one converter material configured to absorb at least part of the primary radiation and to convert the primary radiation into a secondary radiation of an increased wavelength. The converter material or the converter materials or at least one of the converter materials is preferably based on an inorganic material.

For example, the converter material comprises at least one of the following luminescent materials: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$; garnets from the general system $(Gd,Lu,Tb,Y)_3(Al,Ga,D)_5(O,X)_{12}:RE$ with X=halide, N or divalent element, D=tri- or tetravalent element and RE=rare earth metals such as $Lu_3(Al_{1-x}Ga_x)_5O_{12}:Ce^{3+}$, $Y_3(Al_{1-x}Ga_x)_5O_{12}:Ce^{3+}$; $Eu^{2+}$-doped sulfides such as $(Ca,Sr,Ba)S:Eu^{2+}$; $Eu^{2+}$-doped SiONs such as $(Ba,Sr,Ca)Si_2O_2N_2:Eu^{2+}$; SiAlONs for instance from the system $Li_xM_yLn_zSi_{12-(m+n)}Al_{(m+n)}O_nN_{16-n}$; beta-SiAlONs from the system $Si_{6-x}Al_zO_yN_{8-y}:RE_z$; nitrido-orthosilicates such as $AE_{2-x-a}RE_xEu_aSiO_{4-x}N_x$, $AE_{2-x-a}RE_xEu_aSi_{1-y}O_{4-x-2y}N_x$ with RE=rare earth metal and AE=alkaline earth metal; orthosilicates such as $(Ba,Sr,Ca,Mg)_2SiO_4:Eu^{2+}$; chlorosilicates such as $Ca_8Mg(SiO_4)_4Cl_2:Eu^{2+}$; chlorophosphates such as $(Sr,Ba,Ca,Mg)_{10}(PO_4)_6Cl_2:Eu^{2+}$; BAM luminescent materials from the BaO—MgO—$Al_2O_3$ system such as $BaMgAl_{10}O_{17}:Eu^{2+}$; halophosphates such as $M_5(PO_4)_3(Cl,F):(Eu^{2+},Sb^{3+},Mn^{2+})$; SCAP luminescent materials such as $(Sr,Ba,Ca)_5(PO_4)_3Cl:Eu^{2+}$; KSF luminescent materials such as $K_2SiF_6:Mn^{4+}$.

Quantum dots may, moreover, also be introduced as luminescent material. Quantum dots in the form of nanocrystalline materials containing a group II-VI compound and/or a group III-V compound and/or a group IV-VI compound and/or metal nanocrystals are preferred. Further, the conversion material can be made of an additional semiconductor layer sequence comprising multiple quantum wells so that the secondary radiation is generated in the additional semiconductor layer sequence by photoluminescence and is excited by the primary radiation. In this example, the additional semiconductor layer sequence is preferably based on the AlInGaN and/or on the AlInGaP material systems and can in particular include quantum wells both of the AlInGaN and the AlInGaP material systems.

The optoelectronic light source may comprise a multi-layered mirror. Preferably, the multi-layered mirror is planar and, hence, is free or essentially free of any bending. In particular, the multi-layered mirror is a Bragg mirror.

The multi-layered mirror may be located between the semiconductor laser and the converter material. In this example, "located between" may refer to the optical locations of the respective components, that is, to a path the respective radiation travels along.

The multi-layered mirror may be configured to transmit the primary radiation and reflect the secondary radiation. In particular, the multi-layered mirror is controlled for omni-angular reflection of the secondary radiation.

The optoelectronic light source may comprise an optical element provided between the semiconductor laser and the multi-layered mirror. Again, "between" refers to the optical path. The optical element is configured such that the primary radiation coming from the semiconductor laser impinges on the multi-layered mirror at the Brewster angle.

The optoelectronic light source may comprise:
a semiconductor laser configured to produce polarized primary radiation,
a converter material configured to absorb at least part of the primary radiation and convert the primary radiation into a secondary radiation of an increased wavelength,
a planar multi-layered mirror located between the semiconductor laser and the converter material, the multi-layered mirror configured to transmit the primary radiation and reflect the secondary radiation, and
an optical element provided between the semiconductor laser and the multi-layered mirror, wherein the optical element is configured such that the primary radiation coming from the semiconductor laser impinges on the multi-layered mirror at a Brewster angle.

In particular, this optoelectronic light source relies on laser pumping of remote phosphors for transmissive Laser Activated Remote Phosphor, LARP, applications. In the transmissive LARP configuration, two processes can lead to significant loss of more than 50% of the luminescence in the desired forward direction: First, much of the forward directed emission undergoes total internal reflection, TIR for short, in the backward direction and would be lost in the substrate or scattered outside of the desired emission region; and second, all of the backward directed light would be lost in a substrate.

Therefore, the dichroic mirror having high transmission for the collimated short wavelength pump light and high reflectance for the longer wavelength converted light, emitted by the excited luminescent centers, is critical to high efficiency LARP conversion. Typically, the dichroic mirror must have a reflectance of more than 80% or 90% over the broad luminescence spectrum and over all angles of incidence of the secondary radiation, that is, hemispherically incident radiation.

Designing a short-pass dichroic mirror that simultaneously meets all these conditions: high hemispherical reflectance over a broad wavelength range for the secondary radiation while having high transmission of more than 97%, for example, for the pump radiation at an angle of incidence of 0° relative to a perpendicular to the dichroic mirror, is a difficult design problem, especially if the number of layers in the dichroic mirror needs to be limited because the dichroic mirror also forms a thermal path for heat dissipation from the pump region of the phosphor converter to the substrate.

In the optoelectronic light source, an off-axis pumping scheme with a polarized laser diode may be employed, and one can not only improve the pump transmission, but more importantly, eliminate the dichroic design constraint on requiring a high-transmission window at the pump wavelength. This means that by pumping off-axis at or near the Brewster angle within the dichroic stack, one must only design a stack for high, hemispherical reflectance of the luminescence wavelengths of the secondary radiation. Therefore, with reduced control constraints, it is possible to design a dichroic mirror for the transmissive LARP configuration with higher overall reflectance.

The multi-layered mirror may comprise at least five or at least ten or at least 15 mirror layer pairs. Additionally or alternatively, the number of mirror layer pairs is at most 40 or at most 30 or at most 25. Each mirror layer pair is composed of one layer having a first refractive index and one layer having a second refractive index and the first refractive index is higher than the second refractive index. Accordingly, the multi-layered mirror has the basic set-up of a Bragg mirror. However, the optical thicknesses of at least some of the layers in the multi-layered mirror may deviate from a quarter wavelength.

The mirror layer pairs may directly follow one another in the multi-layered mirror. Hence, high-refractive index layers and low-refractive index layers follow one another in an alternating manner in the multi-layered mirror.

The multi-layered mirror may be omnireflective for the secondary radiation for a wide range of angles of incidence. For example, for s-polarized secondary radiation, the average reflectance, averaged over all wavelengths of the secondary radiation, is at least 95% or 97% or 98%. Preferably, the same applies for p-polarized secondary radiation except around the Brewster angle for the radiation. In this respect, polarized light with its electric field along the plane of incidence is thus denoted p-polarized, while light whose electric field is normal to the plane of incidence is called s-polarized.

The multi-layered mirror may be reflective for the primary radiation at an angle of incidence of 0°, that is, at an incidence along a perpendicular of the multi-layered mirror. For example, the reflectivity for the primary radiation at the angle is at least 50% or at least 80% or at least 97%.

Because of the high reflectivity at different wavelengths and different angles of the secondary radiation, the individual optical layer thicknesses of the layers of the multi-layered mirror may have a comparably broad distribution. Having the peak wavelength of the secondary radiation, Ls for short, as a reference wavelength, preferably at least 30% or at least 50% or at least 80% of all the layers having the first and second refractive indices have thicknesses of at most $0.35\ Ls/n_j$ and/or of at least $0.20\ Ls/n_j$, where n is the respective refractive index the layer material designated by the subscript j, and j=1 may apply for the layers of the multi-layered mirror having the lower refractive index and j=2 may apply for the layers of the multi-layered mirror having the higher refractive index. Such a range of layer thicknesses will allow the Bragg mirror to have high reflectivity for the secondary radiation over a broad angular range and over a broad converted light spectrum.

At least one of the layers having the first and second refractive indices may have a thickness of at least $0.15\ Ls/n_j$ and/or at least one of the layers having the first and second refractive indices may have a thickness of at most of $0.4\ Ls/n_j$.

From a light-entrance face for the primary radiation of the optical element to a light-exit face of the converter material, the primary radiation may travel only in condensed matter. In particular, within the block comprising the optical element, the multi-layered mirror and the converter material, the radiation may travel only in solid matter.

The semiconductor laser may be located distant from the optical element. Hence, the primary radiation may travel in sections or completely through a gas or an evacuated area between the semiconductor laser and the optical element.

The semiconductor laser may be located close to the optical element. Hence, the primary radiation may travel only in condensed matter between the semiconductor laser and the optical element. However, this does not exclude that within a housing of the semiconductor laser, like a TO housing, and/or until a first condensing or focusing lens directly following the semiconductor laser, including a fast-axis lens to create a more circular beam if the laser is close to the converter, the laser radiation may travel in a gas or in an evacuated area.

In this example, the semiconductor laser, or the semiconductor layer housing, can directly be applied to the optical element, in particular to the light-entrance face, or there may be an optical wave guide like a glass fiber or integrated optic waveguide between the semiconductor laser, or the semiconductor layer housing, and the optical element. The intervening material may also consist of a transparent bonding material such as UV cured optical glue or silicone.

The optical element may be completely or in part a prism. That is, the optically relevant portion of the optical element is shaped as a prism, while other parts of the optical element may have different shapes to control, for example, a size of the optoelectronic light source. Hence, a planar light-entrance face for the primary radiation of the optical element is oriented in part or completely obliquely with the multi-layered mirror.

The primary radiation may impinge on the light-entrance face of the optical element, in particular of the prism, in a perpendicular manner. Thus, at the light-entrance face the primary radiation may not or not significantly be refracted.

The primary radiation may impinge on the light-entrance face in an off-perpendicular manner. Thus, at the light-entrance face the primary radiation may be refracted and the beam direction may be changed.

The optical element may be a Fresnel prism. Hence, the light-entrance face for the primary radiation of the optical element may be a sawtooth shape. Preferably, individual sawtooth elements are of the same shape contrary to a Fresnel lens. Accordingly, preferably the light-entrance face is on average oriented parallel with the multi-layered mirror. Thus, beside the sawtooth elements, there may be no thickness gradient across the optical element.

The optical element may comprise meta optics having a meta-element structural size of less than a peak wavelength of the primary radiation. Hence, the overall optical element can be of small size.

The optical element may be an optical grating. Preferably, the grating is a transmission grating.

A spot size of the primary radiation at a side of the multi-layered mirror facing the converter material may be at least 10 μm or at least 50 μm. Alternatively or additionally, the spot size is at most 2.0 mm or 500 μm or 100 μm or, preferably, at most 300 μm. Thus, high optical power densities of the secondary radiation can be achieved.

The multi-layered mirror may be connected to the optical element by a first adhesive layer. Alternatively or additionally, the converter material may be connected to the multi-layered mirror by a second adhesive layer. Between the optical element and the multi-layered mirror, there may be a substrate that mechanically carries the multi-layered mirror and the converter material, and that may serve as a heat sink for the converter material.

Thicknesses of the first adhesive layer and/or of the second adhesive layer may each be 0.1 μm to 3 μm or 0.2 μm to 1.5 μm. Thinner adhesive layers are desirable to facilitate heat flow to the heat sink. Provided the refractive index of the adhesive layer $n_b$ is above a critical threshold value, typically above 1.3, the adhesive layer may have no significant effect other than adding some minor reflectivity due to the Fresnel interfaces. This may be suppressed partially by proper mirror design such that partial destructive interference can be attained with these additional interfaces. Such suppression however requires very thin bonding layers, preferably below 0.3 μm, and should have a well-controlled thickness.

As an alternative, there are no adhesive layers at all so that the respective components may be directly arranged at one another. This can be accomplished using wafer bonding techniques, for example.

The peak wavelength of the primary radiation may be at least 300 nm or at least 390 nm or at least 440 nm or at least 450 nm. Alternatively or additionally, the peak wavelength of the primary radiation may be at most 540 nm or 480 nm or 465 nm. That is, preferably the primary radiation may be near ultraviolet radiation or blue light. As an alternative, the primary radiation may also be visible of a longer wavelength or may also be infrared radiation, especially near-infrared radiation.

The secondary radiation may comprise yellow light and/or green light and/or orange light and/or red light, but as an alternative or additionally, the secondary radiation may comprise infrared radiation, especially near-infrared radiation. Thus, the optoelectronic light source can be configured to emit white light or colored light which is a mixture of parts of the primary radiation emitted through the conversion material and of the secondary radiation. As an alternative, the optoelectronic light source can be configured to emit white light or colored light which is composed only of the secondary radiation and which is free of the primary radiation.

The optoelectronic light source may further comprise a heat sink. The heat sink may be the substrate of the multi-layered mirror. Thus, the heat sink may be attached to the multi-layered mirror and/or to the converter material.

The optoelectronic light source can be used, in particular, for projection or automotive applications.

An optoelectronic light source described herein is explained in greater detail below by way of examples with reference to the drawings. Elements which are the same in the individual figures are indicated with the same reference numerals. The relationships between the elements are not shown to scale, however, but rather individual elements may be shown exaggeratedly large to assist understanding.

Many solid-state lighting, SSL, applications require high luminance and high luminous flux. Applications include projection, automotive lighting, stage lighting, medical, and other areas. Often, these applications require a luminance that exceeds the capabilities of LEDs. The LARP, Laser Activated Remote Phosphor, approach can generate much higher luminance than LEDs, and can do so at high power levels. Because of the low étendue of a LARP source such light sources can couple greater power or luminous flux into these étendue-limited applications.

A modified transmissive LARP system 10 is shown in FIG. 1. A focused pump beam P, usually generated by one or more blue emitting laser diodes 2, is incident on a phosphor plate 3 which is bonded to a transparent substrate 34. Usually, the substrate 34 is of a material of high thermal conductivity. The small luminescent region 30 pumped by the laser 2 emits secondary light S in both forward and backward, that is, towards the pump laser 2, directions. However, only the light in the forward direction is collected by the projection system optics 72.

As shown in FIG. 1, a dichroic mirror 4 is used to redirect the backward emitted luminescence or converted light into the desired forward direction. Without such a dichroic mirror 4, at least half of the converted light would go back towards the pump laser 2, resulting in low overall conversion efficiency. It is also important to avoid having converted light or even scattered pump light in the substrate 34. Otherwise, this light will spread laterally beyond the desired low area luminescent region and would degrade overall étendue. This will degrade the desired high luminance emission.

The light generated within the phosphor converter 3 must also escape the total internal reflection, TIR, condition at the emitting surface 33 because the converter material 3 usually has a relatively high refractive index compared to the output medium, which is usually air. This extraction problem is usually mitigated by introducing controlled volume and/or surface scattering to couple the TIR modes into the extractable output modes.

The dichroic mirror 4 is in fact part of the light extraction solution, re-directing both backward direct converted emission and scattered converted and pump light back to the forward direction. Unfortunately, the TIR effects at all the surfaces, combined with the additional scattering needed for light extraction create relatively strong cavity effects within the phosphor converter 3. As a consequence, these cavity effects enhance any small amount of blue or converted light transmission through the dichroic mirror 4. Equivalently, the dichroic mirror "sees" multiple ray bounces from the light within the phosphor converter 3, amplifying the loss effects which occur from the non-ideal reflecting characteristics of a real dichroic mirror 4. Therefore, high overall conversion efficiency or efficacy in the LARP system 10 shown in FIG. 1 requires a dichroic mirror 4 with very high reflectivity over the desired wavelength range and over all angles of incidence within the phosphor converter 3. At the same time, the dichroic mirror 4 must also transmit the partially collimated shorter wavelength pump light P, to maximize coupling of pump light P into the phosphor converter 3.

One of the difficulties in designing a dichroic mirror 4 for transmissive LARP applications is that simultaneously the short wavelength pump light P needs to pass the dichroic mirror 4 with close to 100% transmissivity while reflecting the longer wavelength converted light S with close to 100% reflectivity and at all incident angles. Furthermore, the dichroic coating 4 needs also be limited in overall thickness to minimize thermal resistance to the heat conducting substrate 34.

Because of these multiple constraints, very high omni-directional reflectance of the converted light S is especially difficult to achieve. High thermal conductivity substrate materials such as sapphire also often have higher refractive indices, similar to many ceramic phosphors such as YAG:Ce and, therefore, have a limited effect on high angle reflectance through TIR.

Figure 2:
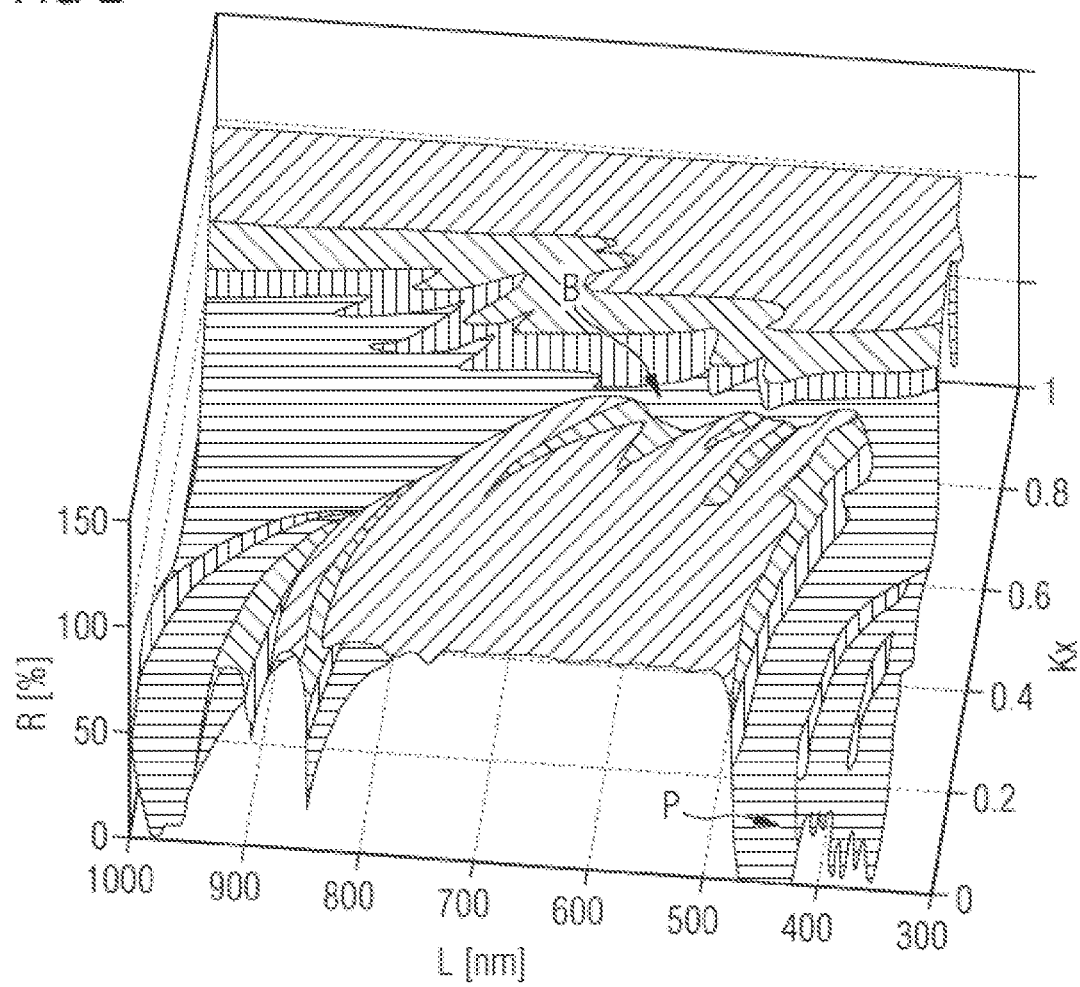
FIG. 2 shows a schematic representation of a reflectivity of a dichroic mirror in the modification of FIG. 1.

To further understand the difficulties of near normal incidence pumping, FIG. 2 shows a reflectance plot over wavelength and angle for p-polarized light for a typical transmissive LARP dichroic thin film as illustrated in FIG. 1. The dichroic mirror 4 has roughly 50 layers, that is, 25 Bragg pairs, which is about the limit for reasonable thermal conductivity. The dichroic mirror is designed such that the reflectance approaches 0% in the region near 450 nm to let pass the pump light P. Simultaneously, the dichroic mirror approaches 100% reflectance over converted light wavelengths from about 480 nm to 700 nm. In FIG. 2, $Kx = \sin \theta_{ph}$, where $\theta_{ph}$ is the angle of incidence on the combined bonding layer—dichroic mirror for light rays generated within the phosphor material.

Unfortunately, a Brewster window also shows up as a region B that reaches 100% transmission at a specific angle where the Brewster condition is met between the two different dichroic mirror materials. The Brewster effect is quite clear, showing a reflection minimum near 0% with Kx=0.6-0.7. The Brewster angle $\theta^B_{ph}$ for the stack, as seen by the phosphor converter 3, can be found from equation (1):

$$Kx = \sin\theta^B_{ph} = \frac{1}{n_{ph}} \frac{n_1 n_2}{\sqrt{n_1^2 + n_2^2}}. \quad (1)$$

$n_1$ and $n_2$ are the refractive indices for the two different dielectric stack materials. The symbol $n_{ph}$ denotes the refractive index of the phosphor material 3. For example, at 550 nm with a YAG phosphor ceramic ($n_{ph}$=1.84) and dielectric coating materials of $SiO_2$ and $Ta_2O_5$ ($n_1$=1.48 and $n_2$=2.20), Kx=0.67, in agreement with the simulated result. It is clear from the reflectance plot in FIG. 2 that achieving both high blue transmission and high, omni-directional converted light reflection severely constrains the dichroic design. Furthermore, the Brewster effect is universal for a two-material dichroic thin film, as seen by the near independence of wavelength, and not easily suppressed. Adding additional Bragg pair groups with different Brewster angles can alleviate some effects, but the design problem is even more challenging and usually leads to only small improvements.

The solution developed in course of the optoelectronic light source to improving omni-directional converted light reflectance without impacting blue transmission or requiring more layers is to make use of the Brewster window observed in FIG. 2, essentially turning it into a passband for the pump light P. This requires polarized pump light P. As a result, if one can bring p-polarized light in from the laser diodes 2 at the appropriate angle, the dichroic mirror 4 needs to be controlled for high converted light reflectance only and the high short-wave passband for the pump light P is not required. This less constrained control problem can lead to improved converted light reflectance, greatly improving overall LARP efficiency or efficacy, even in the presence of the Brewster window at converted light wavelengths.

Thus, by coupling in p-polarized pump light at the Brewster angle, effectively the Brewster window liability is converted into an asset. Although there is still some loss at the Brewster angle of incoherent converted light, the design constraints of the dichroic coating 4 can now be substantially relaxed, and the coating can be more easily designed to be omnireflective over all wavelengths, with a single passband only at the Brewster angle. This brings about substantial quantitative improvements in the efficiency of photon emission per input photon.

Figures 3, 4:
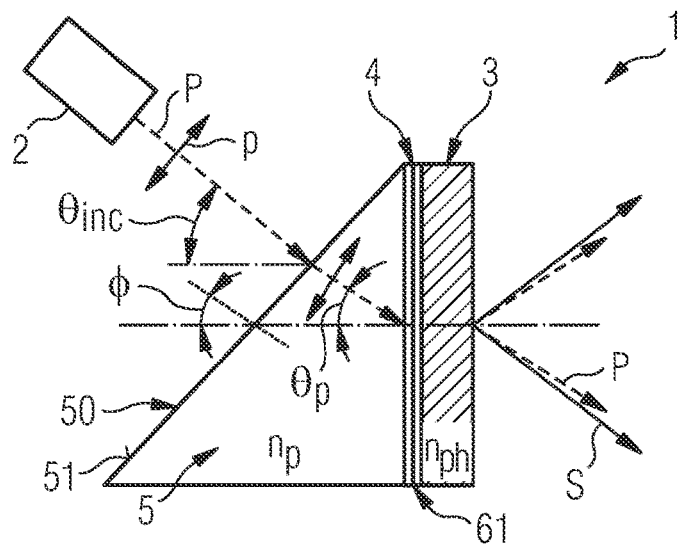
FIG. 3 shows a schematic side view of an example of our optoelectronic light source.
FIG. 4 shows a table of refractive indices and angular information for examples of our optoelectronic light sources.

A basic version of an example is shown in FIG. 3, where a p-polarized pump beam P is incident on the slanted light-entrance face 51 of an optical element 5 that is a prism such that the primary radiation P meets the Brewster angle condition of the dichroic mirror 4 via a first adhesive layer 61. Under these exact conditions, the pump beam P will be transmitted through the dichroic mirror 4 without reflection.

In practice, due to dispersion and the fact that the pump beam P usually has some angular extent due to focusing, the Brewster condition can be met only approximately. However, this implies that one can design the dichroic mirror 4 only for the highest possible reflection of the converted wavelengths S, with much less weighting on transmission of the shorter pump wavelengths. As a result, the control of the dichroic mirror design is far less constrained, leading to higher desired reflectance of converted light from the phosphor material 3.

As shown in FIG. 3, the pump beam P enters the prism face 51. The optical element 5, that is, the prism, is generally required as the Brewster condition could not otherwise be met for typical thin film dielectric materials of the required refractive indices. Refracting the pump light from air into the thin films of the dichroic mirror gives a maximum angle for light in the thin film, which is less than the Brewster angle between these materials. The transverse k-vector $k^B_x$ corresponding to the Brewster's angle within a two-material dielectric stack with low- and high-index materials $n_1$ and $n_2$, respectively, is given by equation (2):

$$k^B_x = k_0 \frac{n_1 n_2}{\sqrt{n_1^2 + n_2^2}}. \quad (2)$$

$k_0 = 2\pi/\lambda_p$ is the free-space wave-number for free-space wavelength $\lambda_p$ of the pump radiation P. This Brewster condition occurs regardless of the thickness of the layers of the multi-layered mirror 4. The pump beam P can propagate through various intervening dielectric materials which are parallel to the dichroic mirror and with refractive index $n_m$ when $k^B_x < n_m k_0$, or for the pump light propagating in the prism 5 in equation (3):

$$n_p > n_{th} = \frac{n_1 n_2}{\sqrt{n_1^2 + n_2^2}}. \quad (3)$$

$n_p$ refers to the refractive index of the prism 5, and $n_{th}$ refers to the threshold refractive index to enable meeting the Brewster condition for the pump radiation P.

For a typical dielectric mirror 4 constructed of $SiO_2/Ti_2O_5$ layers with corresponding refractive indices of $n_1$=1.48 and $n_2$=2.20, and with a prism 5 fabricated from sapphire, for heat conduction, with $n_p$=1.78, bonded with silicone having a refractive index $n_a$=1.41, one obtains a threshold refractive index $n_{th}$=1.23 for the right-hand side of equation (3), which is less than $n_p$ and $n_b$, wherein $n_b$ refers to the refractive index of the at least one adhesive layer 61, 62. The corresponding angle of incidence $\theta_{ph}$, within the prism 5 as shown in FIG. 3, and at which the Brewster condition is achieved within the dielectric mirror 4 is given by equation (4):

$$\theta_p = \sin^{-1}\left(\frac{1}{n_p} \frac{n_1 n_2}{\sqrt{n_1^2 + n_2^2}}\right). \quad (4)$$

In the above example, $\theta_p$=43.9°. Results for several example material systems are shown in FIG. 4, where the low-temperature glass, used for high thermal conductivity bonding, is described in US 2019/0186711 A1, the subject matter of which is hereby incorporated by reference. Such high refractive index bonding glass can greatly minimize extraneous interface reflections due to the adhesive or bonding layer. The angle of the prism face φ can be varied. One could fix the prism normal to match the Brewster condition angle in equation (4) such that the pump beam P enters without deflection, that is, φ=$\theta_p$. This provides a simple way to moderate incident angles that may be easier to configure. Optionally, an anti-reflection coating 50 is applied to the input face 51 of the prism 5.

Another option is to adjust the input face angle φ such that the pump beam also enters at the Brewster angle for the air-prism interface, eliminating the need for the anti-reflection coating 50. One can show from this additional Brewster condition from equation (5):

$$\phi = \theta_p - \tan^{-1}\left(\frac{n_{air}}{n_p}\right). \quad (5)$$

$n_{air}$ refers to the refractive index of air, and in FIG. 3 $\theta_{inc}$ refers to the incoming angle of the pump radiation P.

As shown in FIG. 4, this also leads to relatively shallow prism angles $\phi$, but the pump angle of incidence $\theta_{inc}$ can be quite high. This may not be amenable to all pumping configurations. In general, the results in FIG. 4 and equations (2) to (4) demonstrate that most common dielectric, bonding, and prism materials will accommodate the off-axis Brewster pumping scheme.

As an example of an off-axis Brewster window dichroic mirror 4, an algorithm was run to construct a mirror consisting of Bragg pairs of $SiO_2$ and $Ti_2O_5$. The details of the layers of this exemplary dichroic coating designed with different materials to cover the Brewster window are shown in FIG. 5. This reflectivity should be compared to that shown in FIG. 2. FIG. 2 shows the conventional passband for blue light at normal incidence, which is a requirement on the typical coating that does not have to be met with the coating 4 as used in the optoelectronic light source 1.

To enable a small étendue, a spot size of the primary radiation P at a side of the multi-layered mirror 5 facing the converter material 3 is preferably 5 µm to 500 µm.

The advantage of the optoelectronic light source can be expressed by calculating the photon-to-photon conversion factor, which approximately includes the effect of the multiple reflections from the Fresnel and dichroic interfaces as well as the transmission of blue light. The result for the off-axis dichroic design excited by Brewster angle p-polarized light can be compared to a conventional Bragg stack design with normal incidence unpolarized excitation. This conversion factor is the merit function which is used by the algorithms which design the details of the coatings. It is a number between zero and one, which represents the fraction of input photons which are not converted to emit light out of a light-exit face 33 of the converter material 3.

For example, a merit function of 0.2 implies that 80% of input photons are converted to output photons out of the target facet in FIG. 1. Compared to a design as illustrated in FIG. 3, for p-polarized light coupled in at the Brewster angle, a stopband dichroic reflectivity is slightly more, and the overall conversion efficiency is improved by about 36%. This is a very significant improvement.

Figure 7:
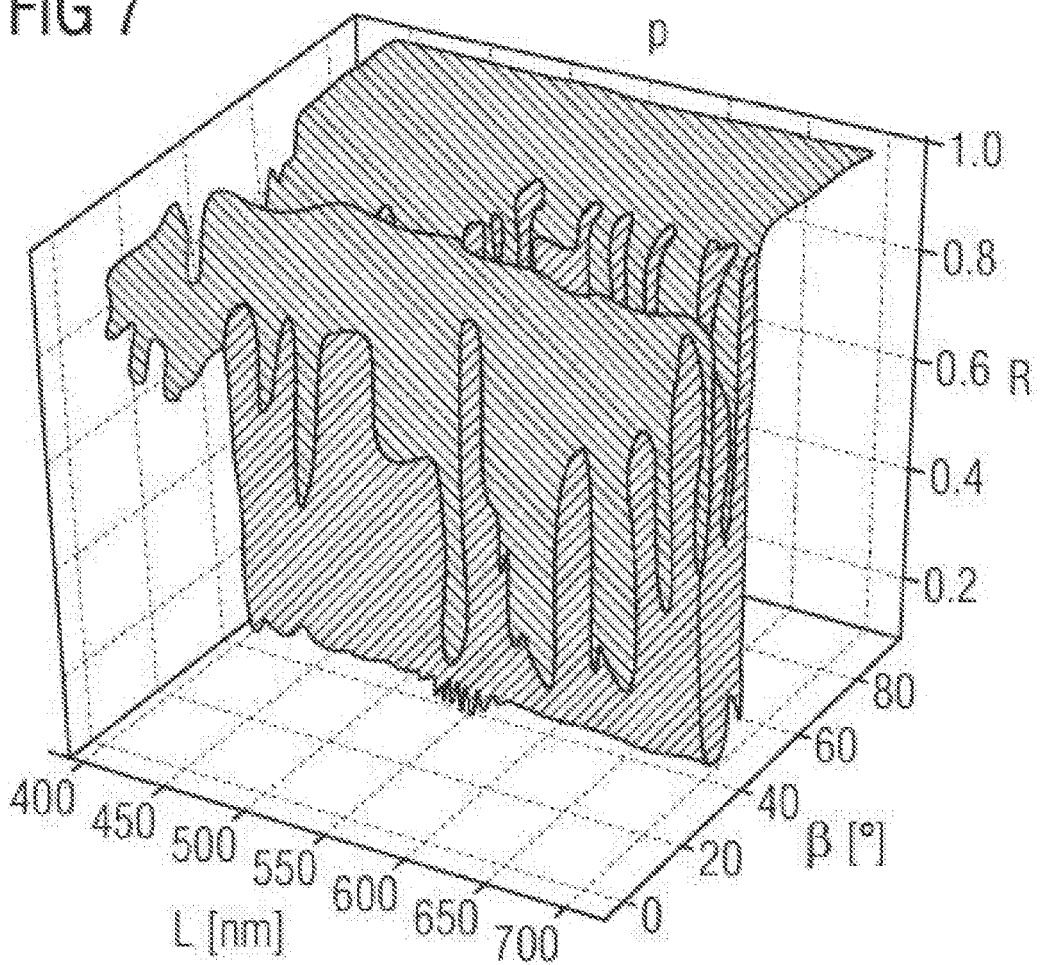
Figure 8:
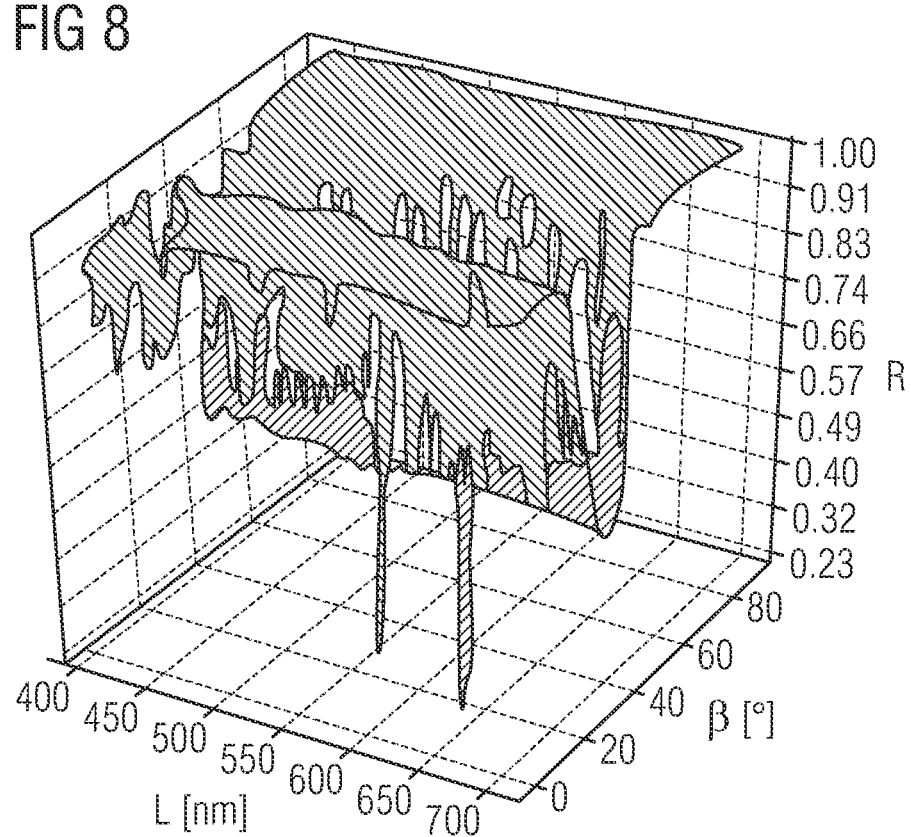

FIGS. 6 to 8 show plots of s, p, and polarization averaged reflectance as a function of wavelength L and internal angle R as observed in the nearby $Ta_2O_5$ layer. FIG. 6 shows the nearly perfect reflectivity obtained with the Brewster pumping approach for s-polarization and FIG. 7 the very nearly 100% reflectivity for p-polarization, except near the Brewster angle. Comparing for polarization averaged reflectance as seen in FIG. 8, for the converted light from the phosphor to the standard configuration in FIG. 2 illustrates clear improvements in reflectivity because of the less constrained control.

Figure 9:
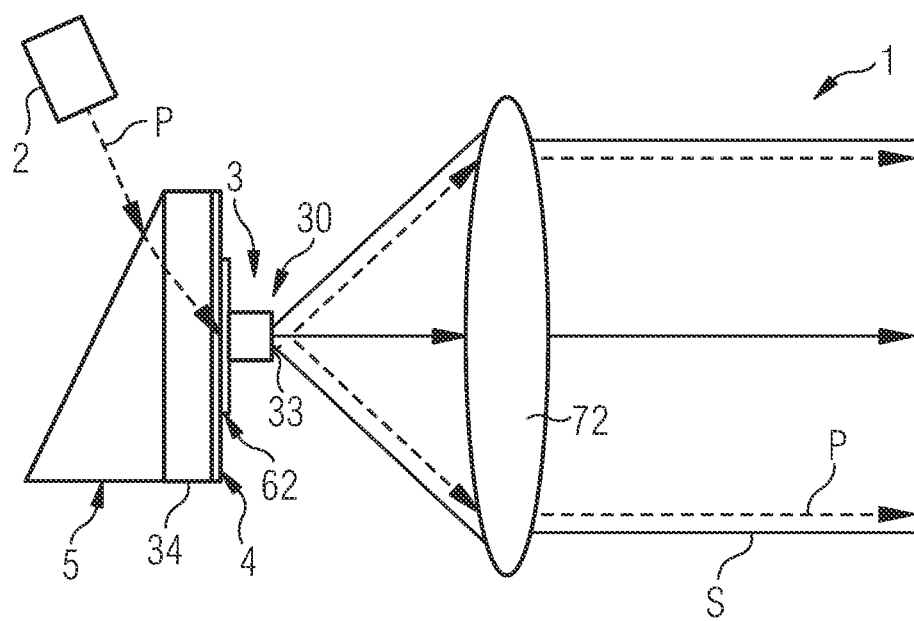

To reduce the concept even more to practice, FIG. 9 shows an example in a typical transmissive LARP configuration. Many methods can be used to perform the beam deflection transformation similar to the prism used as the optical element in FIGS. 3 and 9, for example. This includes both refractive and diffractive methods including meta optics, or combinations of both. Also, applications are not limited to LARP. The purpose of the beam deflector is the same as that of the prism: mainly that the Brewster angle within the dichroic cannot be reached by a propagating wave of any angle of incidence in air, onto the dichroic mirror 4. Equivalently, if $n_{air} \approx 1$, then equation (3) shows that the requirement $n_{air} > n_{th}$ cannot be achieved.

FIG. 10 shows a diagram of a generic beam deflector 5 combined with the off-axis dichroic mirror 4 for pumping a phosphor converter 3 for light emission directed in the forward direction. The thicknesses and shapes of the various layers are not shown to scale, and are expanded to better illustrate the principles and primary parameters. The primary function of the beam deflector 5 is to transform an incident beam P at angle $\theta_{inc}$ to a different angle $\theta_b$, in a bonding or transition layer with refractive index $n_b$. The angle $\theta_b$ needs to meet the Brewster condition within the dichroic from equation (6), similar to equation (4):

$$\theta_b = \sin^{-1}\left(\frac{1}{n_b}\frac{n_1 n_2}{\sqrt{n_1^2 + n_2^2}}\right). \quad (6)$$

In addition, polarization of the light within the bonding or transition layer must also be p-polarized. The beam-deflecting optic 5 may either conserve the polarization, in which case the incident polarization must also be p-polarization. It may also rotate or transform a different incident beam polarization, but yielding p-polarization in the bonding or transition layer.

In some configurations, it may be possible to eliminate the bonding or transition layer. In this example, the more general condition is that the deflected beam has a transverse wave vector given by Equation (2).

In FIG. 11, an example of the multi-layered mirror 4 is schematically illustrated. The multi-layered mirror 4 preferably comprises 10 to 40 mirror layer pairs 44, but not all these layer pairs are shown in FIG. 11 to simplify the illustration. Each mirror layer pair 44 is composed of a first layer 41 having a first refractive index and a second layer 42 having a second refractive index. The first refractive index is higher than the second refractive index. The mirror layer pairs 44 directly follow one another so that high-refractive index layers 41 and low-refractive index layers 42 directly follow one another in an alternating manner in the multi-layered mirror 4.

Figure 12:
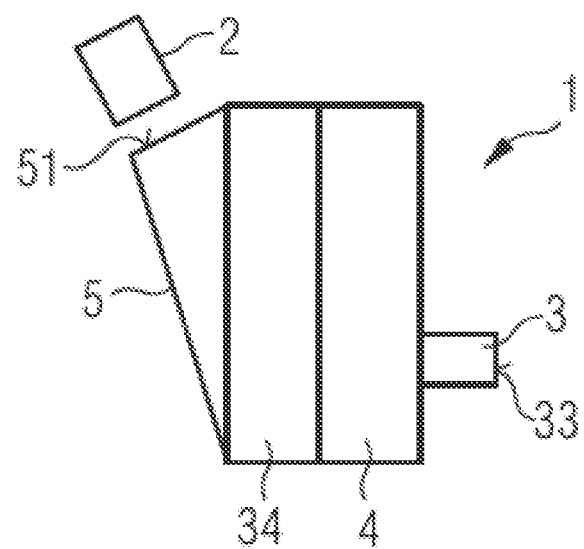
FIGS. 12 to 14 show schematic sectional views of examples of our optoelectronic light sources.

In FIG. 12, in the optoelectronic light source 1 the optical element 5 is a modified prism, compared with FIG. 9, for example, to enable a space-saving configuration. The substrate 34, the optical element 5, the multi-layered mirror 4 and the conversion material 3 may be applied directly to one another, or there may be additional adhesive layers, not shown.

As in all other examples, the first focusing optics 71 and/or the second focusing optics 72 may also be present.

Figure 13:
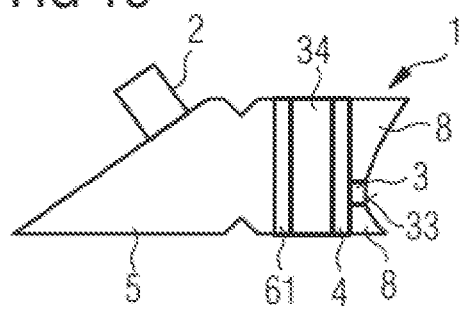

According to FIG. 13, the optoelectronic light source 1 comprises a heat sink 8. As an option, the heat sink 8 may have a front surface formed as a conical reflector. The heat sink 8 may surround the converter material 3, when seen in top view onto the light-exit face 33. Such a heat sink 8 may also be present in all other examples. If such a heat sink is present, as an option the substrate 34 may be omitted.

Further, as an option, according to FIG. 13 the semiconductor laser 2 is applied directly on the optical element 5. The same can be true in all other examples.

To improve mounting of the light source 1, the optical element 5 may comprise a base portion having, for example, indentations.

Figure 14:
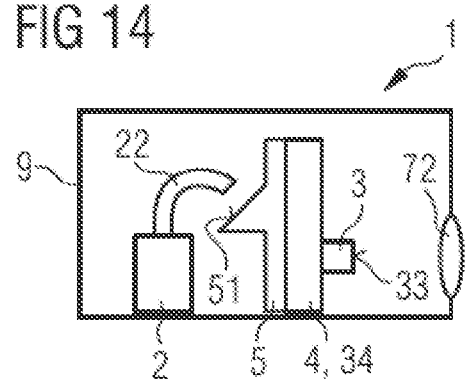

FIG. 14 illustrates that the optoelectronic light source 1 comprises a housing 9 so that a compact set-up can be achieved. The optical element 5 may be shaped as a prism only in the relevant section of the light-entrance face 51. The same can be true in all other examples.

Moreover, as is also possible in all other examples, at least part of the optical path of the primary radiation from the laser 2 to the optical element 5 can be defined by a light guide 22.

Figure 15:
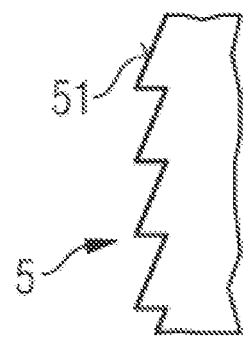
FIGS. 15 and 16 show schematic side views of optical element for examples of our optoelectronic light sources.
Figure 16:
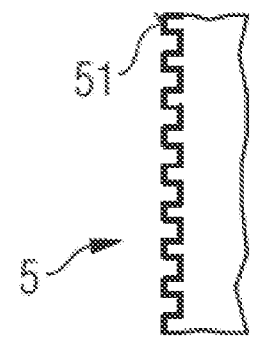
Figure 17:
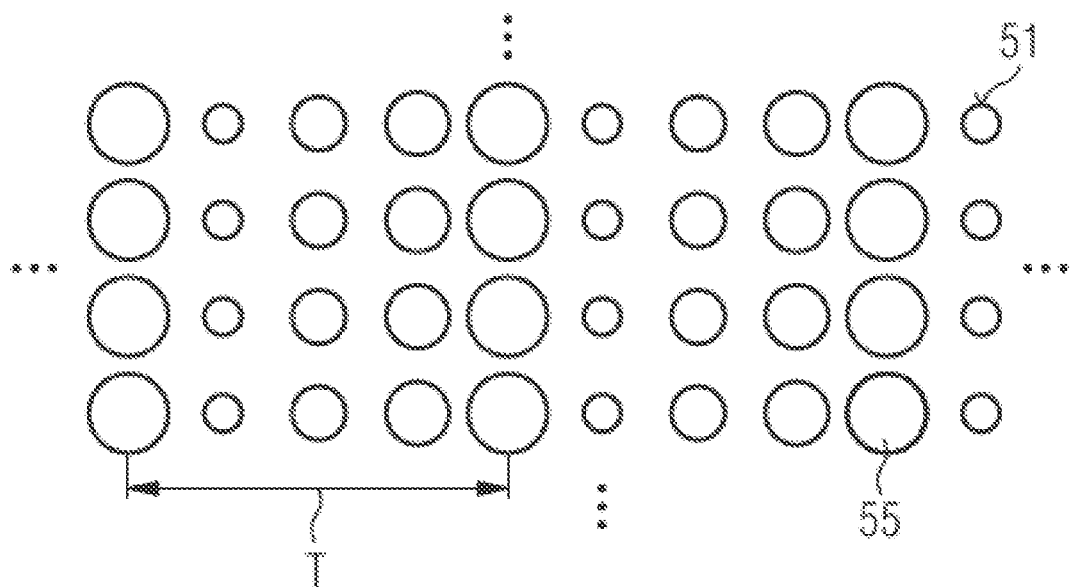
FIG. 17 shows a schematic top view of an optical element for examples of our optoelectronic light sources.

In FIGS. 15 to 17, some further examples of optical elements 5 are illustrated that could each be used in particular in the examples of FIGS. 3, 9 and 10, as well as in all other examples.

According to FIG. 15, the light-entrance face 51 of the optical element 5 is a Fresnel prism. Hence, the light-entrance face 51 for the primary radiation P is of sawtooth fashion. On average, the light-entrance face 51 is oriented in parallel with a side of the optical element 5 opposite the light-entrance face 51. Thus, the prism of, for example, FIGS. 3, 9 or 12 is divided in smaller sub-prisms. Preferably, a size of the sub-prisms, seen in a sectional view as shown in FIG. 15, is larger than the peak wavelength of the primary radiation P.

According to FIG. 16, the optical element 5 comprises an optical grating, preferably at a light-entrance face 51.

Figure 18:
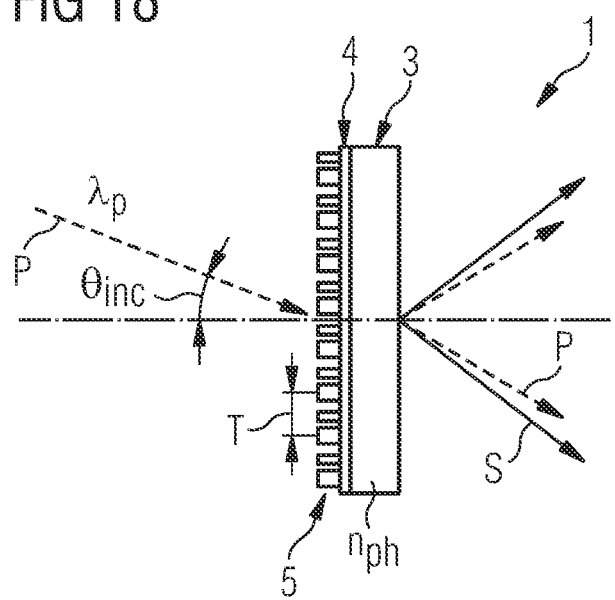
FIG. 18 shows a schematic side view of an example of our optoelectronic light source.

According to FIGS. 17 and 18, the optical element 5 of the light source 1 comprises meta optics. FIG. 17 shows a representative structure for a meta-prism to deflect the incident pump light P into the desired multi-layer mirror Brewster angle. The meta-prism structure uses sub-wavelength spaced pillars 55 made of a high-refractive index dielectric material that impart linear phase variation over a period T. The required period T for a normally incident plane wave on the meta-prism 5 is given by:

$$T = \frac{k_x^B}{2\pi} - \frac{1}{\lambda_p} \sin\vartheta_{inc}.$$

The angle of incidence can be at normal incidence, that is, $\theta_{inc}=0°$.

As one example, the pillars 55 can be arranged on a sub-wavelength lattice such as a square or hexagonal lattice as shown in FIG. 17. The pillars 55 may be fabricated from a number of high refractive index materials that are transparent at the pump wavelength $\lambda_p$. For blue pumping, this may include $TiO_2$, $Ta_2O_5$, $Si_3N_4$, GaN, or many other low absorption materials that are fabricated using nano-fabrication techniques such as e-beam or DUV lithography.

Pillar diameters of the pillars 55 may be 25 nm to 500 nm, depending on the wavelength and on the period T. Pillar heights are preferably constant and may be 200 nm to 1000 nm, but can vary depending on the design and requirements. The period T is not limited to a single $2\pi$ phase change and can be multiples of $2\pi$, but this requires the pillars 55 to impart up to multiple $2\pi$ phase changes which require taller pillars 55 and closer spacing. This can be difficult to implement lithographically.

Additionally, pillars 55 do not have to be circular cylinders, but as described in U.S. Pat. No. 10,132,465 B2, the pillars 55 may have non-circular cross-sections such as elliptical shapes. The overall design of the beam deflector pattern within a period T can also be controlled using algorithms as described in U.S. Pat. No. 10,132,465 B2, for example, the subject matter of which, referring to the pillars, is incorporated herein by reference.

Finally, one may eliminate the external focusing lens for the pump beam by combining the meta-prism function and focusing function in one meta-optic 5 as shown in FIG. 18.

Our light sources are not restricted by the description given with reference to the examples. Rather, this disclosure encompasses any novel feature and any combination of features, including in particular any combination of features in the appended claims, even if the feature or combination is not itself explicitly indicated in the claims or examples.

The invention claimed is:

1. An optoelectronic light source comprising:
   a semiconductor laser configured to produce polarized primary radiation,
   a converter material configured to absorb at least part of the primary radiation and convert the primary radiation into a secondary radiation of an increased wavelength,
   a planar multi-layered mirror located between the semiconductor laser and the converter material, the multi-layered mirror configured to transmit the primary radiation and reflect the secondary radiation, and
   an optical element provided between the semiconductor laser and the multi-layered mirror,
   wherein the optical element is configured such that the primary radiation coming from the semiconductor laser impinges on the multi-layered mirror at a Brewster angle.

2. The optoelectronic light source according to claim 1, wherein the multi-layered mirror comprises 10 to 40 mirror layer pairs, each mirror layer pair is composed of one layer having a first refractive index and one layer having a second refractive index and the first refractive index is higher than the second refractive index, and the mirror layer pairs directly follow one another so that high-refractive index layers and low-refractive index layers follow one another in an alternating manner, and the multi-layered mirror is angle-omnireflective for the secondary radiation and is reflective for the primary radiation at an angle of incidence of 0°.

3. The optoelectronic light source according to claim 2, wherein at least 30% of all the layers having the first and second refractive indices have thicknesses of at most 0.35 Ls/$n_j$, or of at least 0.20 Ls/$n_j$, Ls being a peak wavelength of the secondary radiation, where n is the respective refractive index of the layer material designated by the subscript j, and
   at least one of the layers having the first or second refractive index has a refractive index of at most 0.15 Ls and at least one of the layers having the first or second refractive index has a refractive index of at least 0.4 Ls.

4. The optoelectronic light source according to claim 1, wherein from a light-entrance face for the primary radiation of the optical element to a light-exit face of the converter material, the primary radiation travels only in condensed matter.

5. The optoelectronic light source according to claim 1, wherein the semiconductor laser is located distant from the optical element so that the primary radiation travels at least in sections through a gas or an evacuated area between the semiconductor laser and the optical element.

6. The optoelectronic light source according to claim 1, wherein the semiconductor laser, or a housing of the semiconductor layer, is located close to the optical element so that the primary radiation travels only in condensed matter between the semiconductor laser, or the housing of the semiconductor layer, and the optical element.

7. The optoelectronic light source according to claim 1, wherein the optical element is a prism, a planar light-entrance face for the primary radiation of the optical element being oriented obliquely with the multi-layered mirror.

8. The optoelectronic light source according to claim 7, wherein the primary radiation impinges on the light-entrance face in a perpendicular manner.

9. The optoelectronic light source according to claim 7, wherein the primary radiation impinges on the light-entrance face in an off-perpendicular manner.

10. The optoelectronic light source according to claim 1, wherein the optical element is a Fresnel prism so that a light-entrance face for the primary radiation of the optical element is a sawtooth shape and is on average oriented parallel to the multi-layered mirror.

11. The optoelectronic light source according to claim 1, wherein the optical element comprises meta optics having a structural size of less than a peak wavelength of the primary radiation.

12. The optoelectronic light source according to claim 1, wherein the optical element comprises an array of diffractive optical structures at a light-entrance face for the primary radiation.

13. The optoelectronic light source according to claim 1, wherein a spot size of the primary radiation at a side of the multi-layered mirror facing the converter material is 10 μm to 500 μm.

14. The optoelectronic light source according to claim 1, wherein the multi-layered mirror is connected to the optical element by a first adhesive layer, and the converter material is connected to the multi-layered mirror by a second adhesive layer, and thicknesses of the first adhesive layer and of the second adhesive layer are each 0.1 μm to 3 μm.

15. The optoelectronic light source according to claim 1, wherein a peak wavelength of the primary radiation is 390 nm to 480 nm, the secondary radiation is yellow light, and the optoelectronic light source is configured to emit white light which is a mixture of parts of the primary radiation emitted through the conversion material and of the secondary radiation.

16. The optoelectronic light source according to claim 1, further comprising a heat sink attached to the multi-layered mirror and the converter material.

* * * * *